US012644934B2

(12) United States Patent　　　　　(10) Patent No.:　US 12,644,934 B2

Nidhiudhayan et al.　　　　　　　　　(45) Date of Patent:　　　Jun. 2, 2026

(54) SYSTEM FOR DETECTING CABLE CONNECTIVITY STATUS IN UTILIZING PLUG AND RECEPTACLE CONNECTORS AND A METHOD THEREOF

(71) Applicant: E-CON SYSTEMS INDIA PRIVATE LIMITED., Chennai (IN)

(72) Inventors: I Nidhiudhayan, Chennai (IN); L Sathiyanarayanan, Chennai (IN)

(73) Assignee: E-CON SYSTEMS INDIA PRIVATE LIMITED., Chennai (IN)

( * ) Notice:　Subject to any disclaimer, the term of this patent is extended or adjusted under 35 U.S.C. 154(b) by 187 days.

(21) Appl. No.: 18/778,043

(22) Filed:　　Jul. 19, 2024

(65)　　　　Prior Publication Data

US 2026/0023134 A1　　Jan. 22, 2026

(51) Int. Cl.
　　*G01R 31/58*　　　(2020.01)
　　*G01R 31/66*　　　(2020.01)
(52) U.S. Cl.
　　CPC ............. *G01R 31/58* (2020.01); *G01R 31/66* (2020.01)

(58) Field of Classification Search
　　CPC ............................... G01R 31/58; G01R 31/66
　　See application file for complete search history.

(56)　　　　References Cited

U.S. PATENT DOCUMENTS

| | | | |
|---|---|---|---|
| 4,837,488 A * | 6/1989 | Donahue | ................ G01R 31/60 |
| | | | 379/21 |
| 2015/0097550 A1 * | 4/2015 | Aldereguia | ............ G01R 31/66 |
| | | | 324/76.39 |

* cited by examiner

*Primary Examiner* — Tung X Nguyen
(74) *Attorney, Agent, or Firm* — Sage Patent Group

(57)　　　　ABSTRACT

A system for detecting a connectivity status of a cable connector assembly or a device includes a cable having one or more conductive layers to act as a shield, provide required impedance for electrical signals in an inner most conductive layer, and provides electromagnetic interference (EMI) shielding, one or more insulation layers surrounding the cable, a plug connector of use for mounting on a PCB and a receptacle connector. The plug connector includes a center contact terminated as a center contact pin, at least two cable connection status pins layered within a housing of the plug connector terminated as two cable connection status pins to detect the connectivity status of the cable or the device and health status of the cable.

17 Claims, 5 Drawing Sheets

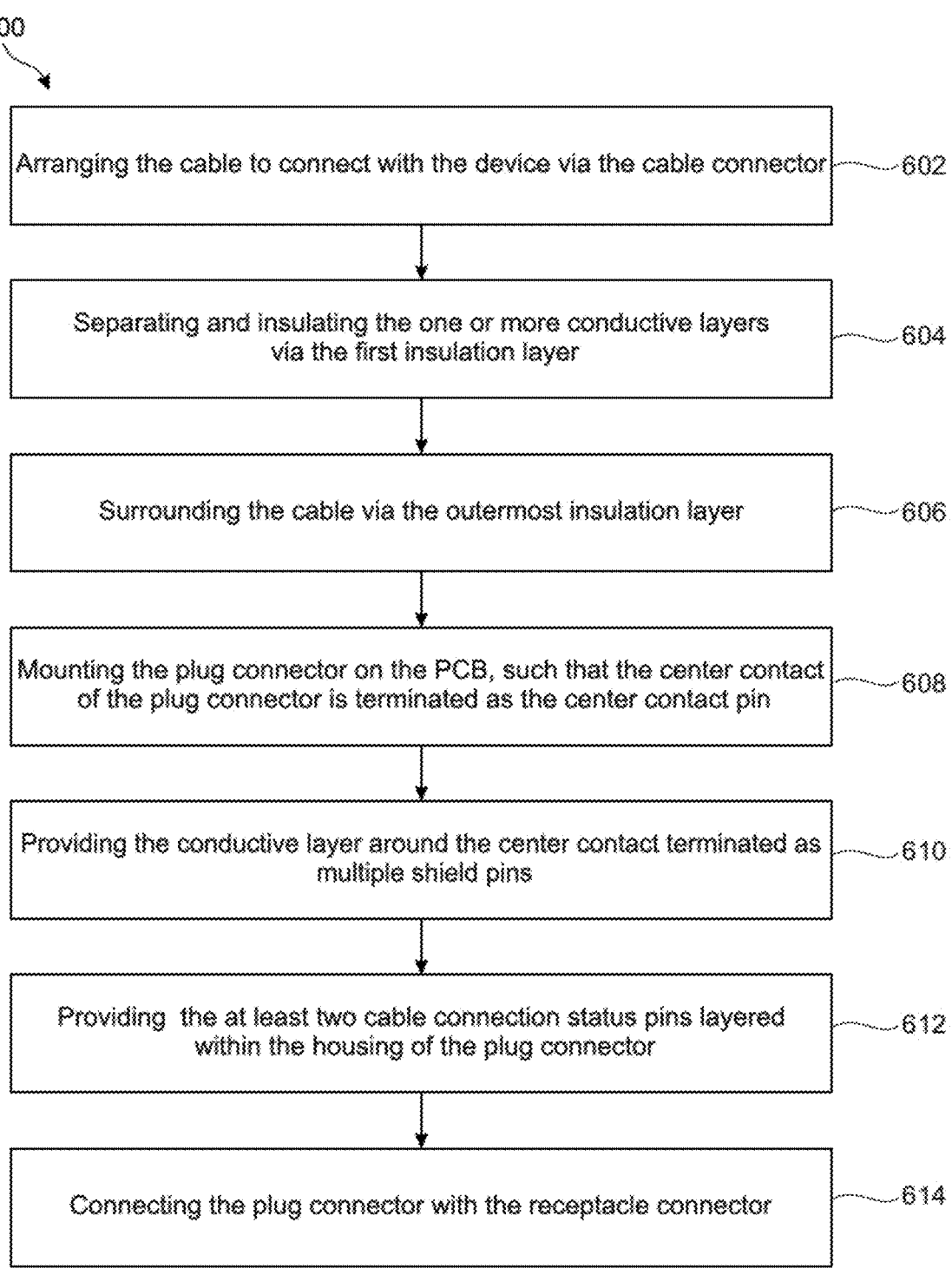

600

Arranging the cable to connect with the device via the cable connector — 602

Separating and insulating the one or more conductive layers via the first insulation layer — 604

Surrounding the cable via the outermost insulation layer — 606

Mounting the plug connector on the PCB, such that the center contact of the plug connector is terminated as the center contact pin — 608

Providing the conductive layer around the center contact terminated as multiple shield pins — 610

Providing the at least two cable connection status pins layered within the housing of the plug connector — 612

Connecting the plug connector with the receptacle connector — 614

Fig. 5

SYSTEM FOR DETECTING CABLE CONNECTIVITY STATUS IN UTILIZING PLUG AND RECEPTACLE CONNECTORS AND A METHOD THEREOF

TECHNICAL FIELD

The present disclosure generally relates to a device (camera device). More particularly, it relates to a cable connector assembly with a detection mechanism to verify a connection status of a cable or the device.

BACKGROUND OF THE INVENTION

Plug connectors serve the purpose of establishing an electrical connection with a corresponding mating plug connector. When referring to a plug connector or mating plug connector, it involves various forms such as plugs, sockets, couplings, or adapters. Connectors, especially those designed with modularity in mind, often feature an outer housing shell. Within this housing, individual contact assemblies can be inserted. These contact assemblies typically consist of an outer conductor contact and an inner conductor contact, with the inner conductor contact running within the outer conductor contact. These contact assemblies are then connected to corresponding conductors of an electrical cable, facilitating transmission of electrical signals.

In plug connectors, hot plugging is a feature in electrical circuits that allows a device to be connected and disconnected without the need of shutting down the device of a system. In many applications, especially those requiring continuous operation or frequent changes in device configurations, hot plugging offers significant advantages. When devices are hot pluggable, users can connect or disconnect them while the system remains powered on, thereby eliminating the need for downtime during maintenance or reconfiguration. This capability is particularly valuable in environments where uninterrupted operation is critical, such as data centres, industrial automation systems, and telecommunications networks.

Even though hot plugging has advantages, there are certain disadvantages during hot plugging in cable connectors where several problems can occur. Primarily, there is a risk of electrical surges or spikes, which can damage the connected devices or the system. During hot plugging, surge protection is critical to mitigate the risk of voltage spikes or surges that can potentially damage the devices or circuitry. Without any means of monitoring cable connectivity or implementing surge protection mechanisms, the system becomes vulnerable to electrical disturbances that may arise from the sudden connection or disconnection of devices. These voltage irregularities can lead to component failure, data loss, or even system downtime.

Therefore, it is crucial to establish a system for detecting the connectivity status of cables or devices and monitoring the health of the cables.

SUMMARY OF THE INVENTION

According to the main embodiment of the present invention, a system for detecting a connectivity status of a cable or a device and health status of the cable, wherein the cable connects to the device via a cable connector. The system offers real-time monitoring and notification of cable health issues, thereby enhancing operational efficiency, preventing device damage, and improving user experience by alerting users to connectivity issues.

According to the main embodiment of the present invention, the system comprising a cable which further comprises one or more conductive layers having, an inner-most conductive layer for carrying electrical signals and power for the device, an outer most conductive layer divided into two equal segments separated from each other and used for the cable or device connectivity and health detection, an intermediate conductive layer arranged between the inner most conductive layer and the outer most conductive layer to: act as a shield, provide required impedance for electrical signals in the inner most conductive layer, and provide electromagnetic interference (EMI) shielding, one or more insulation layers comprising: a first insulation layer for separating and insulating the one or more conductive layers, and an outermost insulation layer surrounding the cable.

According to the main embodiment of the present invention, a plug connector of use for mounting on a Printed Circuit Board [PCB], comprising a center contact terminated as a center contact pin for making electrical contact with a center contact of a mating connector; a conductive layer provided around the center contact terminated as multiple shield pins to shield inner components of the plug connector from external electromagnetic interference; and at least two cable connection status pins layered within a housing of the plug connector terminated as two cable connection status pins.

According to the main embodiment of the present invention, a receptacle connector of use for connecting with the plug connector comprising: a socket center contact for making electrical contact with the center contact of the plug connector, an inner socket conductive layer for connecting with the conductive layer of the plug connector, and an outer most conductive layer divided into two equal segments separated from each other and used for making electrical connection with the cable connection status pins layered within the housing of the plug connector, wherein the receptacle connector when connected with the plug connector detects connectivity and health status of the cable by providing a cable connect status signal using one of the connection status pins of the plug connector.

According to another embodiment of the present invention, the system comprises a level detection and monitoring block for monitoring voltage and current levels for various case parameters and interpreting results of the monitored levels to provide the connectivity status of the cable or the device and health status of the cable.

According to another embodiment of the present invention, the system comprises a microcontroller for receiving the cable connect status signal and initiating corresponding actions comprising turning power ON or OFF for a device, providing notifications to host processor upon device detection and cable malfunction, and alerting user about connection status of the device.

According to another embodiment of the present invention, wherein the center contact with the central contact pin is connected with the PCB and used for electrical signals and power.

According to another main embodiment of the present invention, wherein the conductive layer with the multiple shield pins is connected to the PCB for electrical grounding.

According to another main embodiment of the present invention, wherein the cable connection status pins are connected to the PCB for monitoring the connectivity status of the cable or the device and health status of the cable, wherein the health status of the cable comprises the cable having a cut, crush or breakage or damage to the cable.

According to another main embodiment of the present invention, wherein the inner most conductive layer connects with the center contact of the receptacle connector, an intermediate conductive layer of the cable connects with the inner socket conductive layer of the receptacle connector and an outer most conductive layer of the cable is connected with the outer most conductive layer of the receptacle connector.

According to another main embodiment of the present invention, wherein the cable or the at least two cable connection status pins of the plug connector is connected to a level detection and monitoring block to initiate the cable connect status signal, wherein the receptacle connector mates with the plug connector, and the two cable connection status pins layered with the housing of the plug connector makes contact with the outer two segmented conductive layer in the receptacle connector to the initiate the detection.

According to another main embodiment of the present invention, wherein multiple cables with different configurations present in multiple plug connectors, and wherein each individual cable of the multiple cables present within a single plug connector of the multiple plug connectors is monitored for detection of the connectivity status of the cable or the device and health status of the cable.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

FIG. 5 illustrates a method for detecting a connectivity status of a cable or a device and health status of the cable according to the present invention.

DETAILED DESCRIPTION

Figure 1:
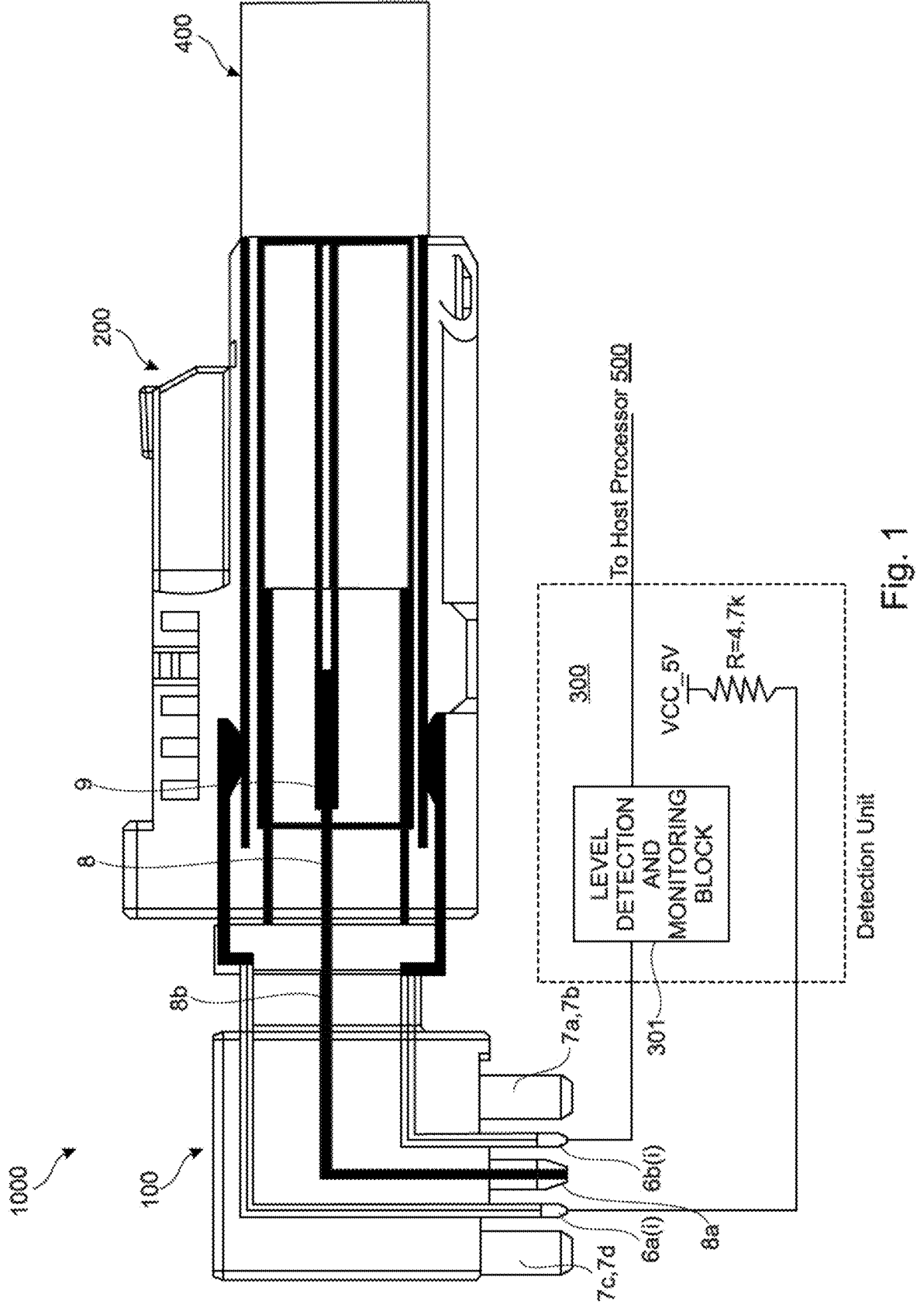
FIG. 1 illustrates a system for detecting a connectivity status of a cable or a device and health status of the cable according to the present invention.

Aspects of the present disclosure will be described more fully hereinafter with reference to the accompanying drawings. The systems disclosed herein can, however, be realized in many different forms and should not be construed as being limited to the aspects set forth herein. Like numbers in the drawings refer to like elements throughout.

The terminology used herein is for the purpose of describing particular aspects of the disclosure only and is not intended to limit the invention. It should be emphasized that the term "comprises/comprising" when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Embodiments of the present disclosure will be described and exemplified more fully hereinafter with reference to the accompanying drawings. The solutions disclosed herein can, however, be realized in many different forms and should not be construed as being limited to the embodiments set forth herein.

It will be appreciated that when the present disclosure is described in terms of a system, it may also be embodied in one or more processors and one or more memories coupled to the one or more processors, wherein the one or more memories store one or more programs that perform the steps, services and functions disclosed herein when executed by the one or more processors.

Cable in a conventional art serves as a physical conduit through which power or electrical signals are transmitted between two separate electrical systems. This includes various scenarios such as connecting a power source to an appliance, linking different components within a circuit, or facilitating communication between electronic devices.

FIG. 1 illustrates a system 1000 for detecting a connectivity status of a cable (400) or a device and health status of the cable. The cable (400) connects to the device via a cable connector.

Figures 2A, 2B:
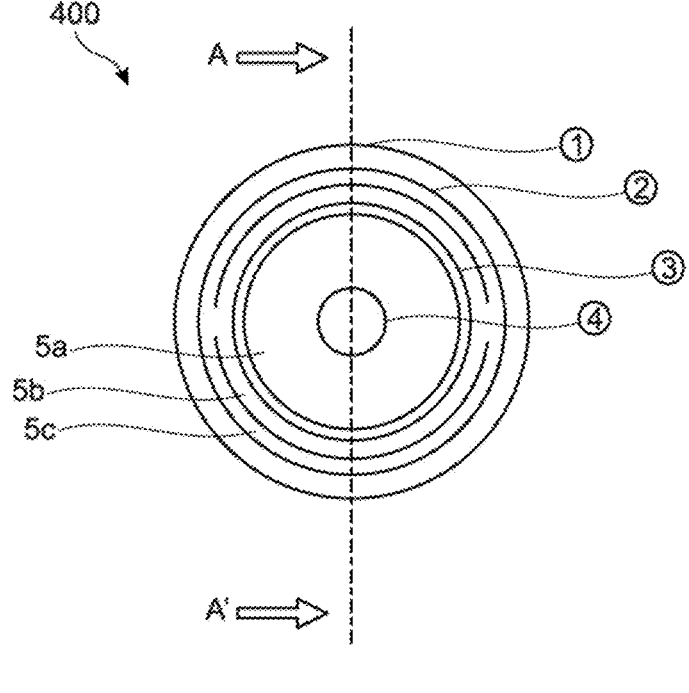
FIGS. 2a and 2b depict the cross-sectional views of a cable according to the present invention.

FIGS. 2a and 2b in combination depict the cross-sectional views of the cable (400) according to the present invention. FIG. 2b explicitly depicts the cross-sectional view A-A' of FIG. 2a. The cable (400) comprises of one or more conductive layers (2, 3, 4). The one or more conductive layers (2, 3, 4) comprises an inner-most conductive layer (4) for carrying electrical signals and power for the device, an outer most conductive layer (2) divided into two equal segments separated from each other and used for the cable (400) or device connectivity and health detection and an intermediate conductive layer (3) arranged between the inner most conductive layer (4) and the outer most conductive layer (2) to: act as a shield, or provide required impedance for electrical signals in the inner most conductive layer (4), or provide electromagnetic interference (EMI) shielding.

The system (1000) further comprises one or more insulation layers (1, 5) comprising a first insulation layer (5) for separating and insulating the one or more conductive layers (2, 3, 4), and an outermost insulation layer (1) surrounding the cable (400). The system (1000) further comprises a plug connector (100) of use for mounting on a Printed Circuit Board [PCB]. The plug connector (100) comprises a center contact (8) terminated as a center contact pin (8a) for making electrical contact with a center contact of a mating connector, a conductive layer (7) provided around the center contact (8) terminated as multiple shield pins (7a, 7b, 7c, 7d) to shield inner components of the plug connector (100) from external electromagnetic interference and at least two cable connection status pins (6a, 6b) layered within a housing of the plug connector (100) terminated as two cable connection status pins (6a[i], 6b[i]) to detect the connectivity status of the cable (400) or the device and health status of the cable (400).

The system (1000) further comprises a receptacle connector (200) of use for connecting with the plug connector (100). The receptacle connector (200) comprises of a socket center contact (9) for making electrical contact with the center contact (8) of the plug connector (100), an inner socket conductive layer (10) for connecting with the conductive layer (7) of the plug connector (100) and an outer most conductive layer (11a, 11b) divided into two equal segments separated from each other and used for making electrical connection with the cable (400) connection status pins (6a, 6b) layered within the housing of the plug connector (100). The receptacle connector (400) when connected with the plug connector (100) detects connectivity and the health status of the cable (400) by providing a cable connect status signal using one of the connection status pins (6a[i], 6b[i]) of the plug connector (100).

Further details of the cable (400) will now be discussed. The inner-most conductive layer (4) serves for the purpose of transmitting electrical signals and supplying power to the device. The outer most conductive layer (2) is divided into two equal segments where the two segments are separated from each other. Further, the intermediate conductive layer (3) is arranged between the inner most conductive layer (4) and the outer most conductive layer (2) to offer important functionalities such as shielding, resistance against electromagnetic interference and impedance control.

The intermediate conductive layer (3) advantageously acts as a shield by providing additional protection for the inner-most conductive layer (4). The shielding as described above helps in preventing external electromagnetic interference (EMI) from affecting the signals transmitted through the cable (400). Further, the intermediate conductive layer (3) influences to control the impedance of the electrical signals within the inner-most layer (4). By providing the required impedance, the intermediate conductive layer (3) ensures that the electrical signals are maintained efficiently through the cable (400) without distortion or loss of signal quality.

Additionally, the intermediate conductive layer (4) provides electromagnetic interference (EMI). The EMI occurs when electromagnetic radiation emitted by external sources interferes with the signals transmitted through the cable (400). Using the intermediate conductive layer (3), the cable (400) can effectively block or reduce the impact of EMI, thereby enhancing the performance of the electrical system. Therefore, the intermediate conductive layer (4) acts as a shield, provides required impedance for electrical signals in the inner most conductive layer (4), and provides EMI shielding. It should be understood that the conductive layer is made of various materials capable of transferring electrical signals. For example, these materials can include copper, aluminum, silver, gold, or conductive alloys comprising a combination of elements such as copper, silver, nickel, tin, and conductive polymers.

The Cable (400) is insulated by one or more insulation layers. The first insulation layer is provided for insulating the one or more conductive layers (2, 3, 4) in the inner portions of the cable 400, and the outermost insulation layer (1) is provided for insulating the surrounding outer portion of the cable. The insulation of the first insulation layer in the Cable (400) can be further explained by the following: the innermost conductive layer (4) is surrounded by the insulation layer (5a), with a diameter greater than that of the innermost conductive layer (4). The intermediate conductive layer (3) is insulated by another insulation layer (5b), also with a diameter greater than that of the innermost conductive layer (4) and the insulation layer (5a). The outermost conductive layer (2) having two segments, is insulated by yet another insulation layer (5c), with a diameter greater than that of the outermost conductive layer (2) and the insulation layers (5a and 5b). Finally, the outermost insulation layer (1) covers all of the above layers.

The insulation layers insulate or restrict the flow of electrical signals between the aforementioned conductive layers which are used based on factors such as electrical properties, temperature resistance, flexibility, environmental conditions and applications. The first insulation layer (4) and the outermost insulation layer (1) can be made of same or different materials. Materials such as Polyvinyl Chloride, Cross-linked Polyethylene, Ethylene Propylene Rubber, Silicone Rubber, Polyethylene (PE) and Fluoropolymers (e.g., PTFE, FEP, ETFE) are used based on the application.

Figure 3:
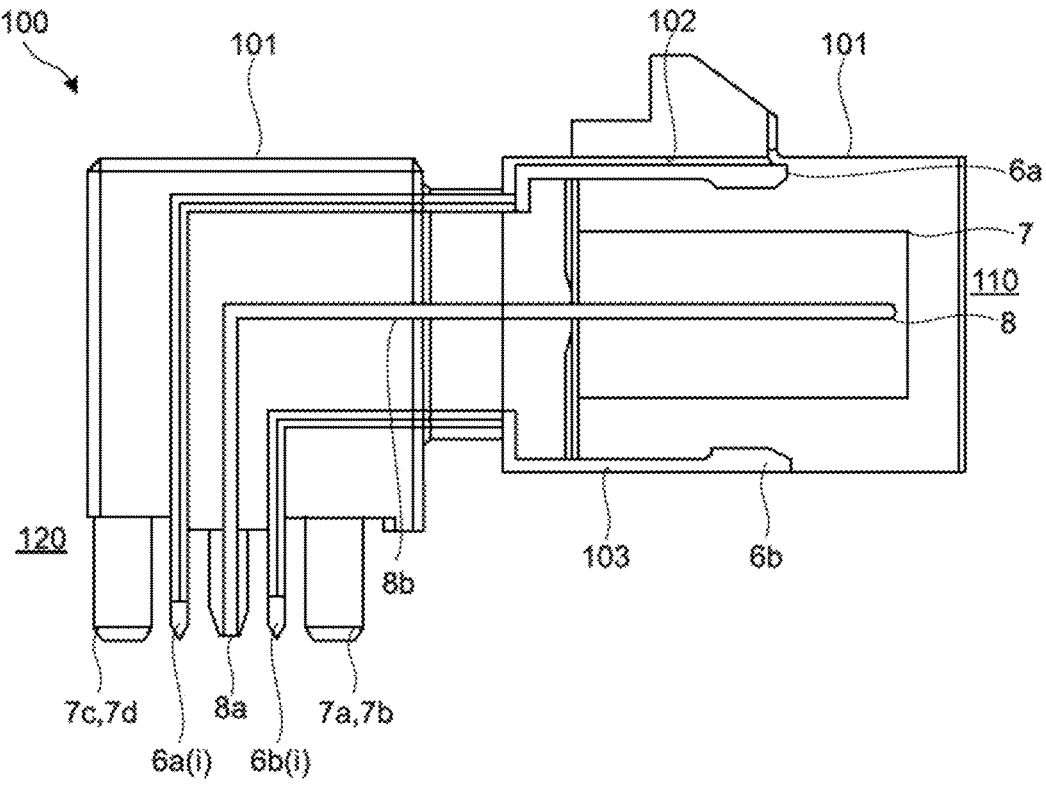
FIG. 3 depicts the plug connector according to the main aspect of the present invention.

FIG. 3 depicts the plug connector (100) according to the main aspect of the present invention. The plug connector (100) as depicted is typically a male connector with prongs or pins that can be inserted into a corresponding female connector, socket, or outlet. For example, it is used to connect devices such as lamps, appliances, computers, audio/video equipment, and power tools to electrical outlets or other equipment. The plug connector (100) as described by the present invention has a positive locking mechanisms to ensure proper alignment and secure connections between two electrical systems. The housing of the plug connector (100) is usually made of insulating materials such as plastics including polyvinyl chloride (PVC), polycarbonate (PC), acrylonitrile butadiene styrene (ABS), and thermoplastic elastomers (TPE), Rubber or silicone materials, Glass-Reinforced Plastic (GRP) or Fiberglass based on the requirements and applications.

The plug connector (100) as depicted by the present invention comprises a housing (101) having the required constructional features of male positive locking mechanism. The housing (101) comprises a first end (110) and second end (120), where the first end (110) of the housing (101) is configured to receive the first end (210) of a receptacle (i.e., female connector). The second end (120) of the housing (101) is mounted on the PCB board (not shown) by a fixing means. The housing (101) comprises a center contact (8) responsible for establishing or transmitting electrical connections between the plug connector (100) and the PCB board. The center contact (8) is positioned within the housing (101), particularly at the center portion of the housing, starting from the first end (110) and reaching the second end (120), where it is terminated as a center contact pin (8a). The center contact (8) with the central contact pin (8a) is connected with the PCB and used for electrical signals and power.

The plug connector (100) further comprises a conductive layer (7) surrounding the center contact (8), positioned at the front end (110) of the housing (100). The conductive layer (7) extends to the second end (120) and connected to multiple shield pins (7a, 7b, 7c, 7d) where it ends. The shield pins (7a, 7b, 7c, 7d) are configured to shield the inner components of the plug connector (100) from external electromagnetic interference. The conductive layer (7) with the shield pins (7a, 7b, 7c, 7d) is connected to the PCB for electrical grounding.

The plug connector (100) further comprises at least two cable connection status pins (6a, 6b) made up of conductive elements disposed in the front end (110) of the housing (101). The cable connection status pin (6a) is mounted on the inner wall of the housing (101), preferably on the first inner side (102) of the housing (101). Similarly, the cable connection status pin (6b) is mounted on the inner wall of the housing (101), preferably on the second inner side (103) of the housing (101). The cable connection status pins (6a, 6b) are connected to cable connection status pins (6a[i], 6b[i]) where they are terminated as the second end (120) of the housing (101). The cable connection status pins (6a[i], 6b[i]) are connected to the PCB for monitoring the connectivity status of the cable (400) or the device and health status of the cable (400), wherein the health status includes crush or breakage or damage to the cable (400).

Figure 4:
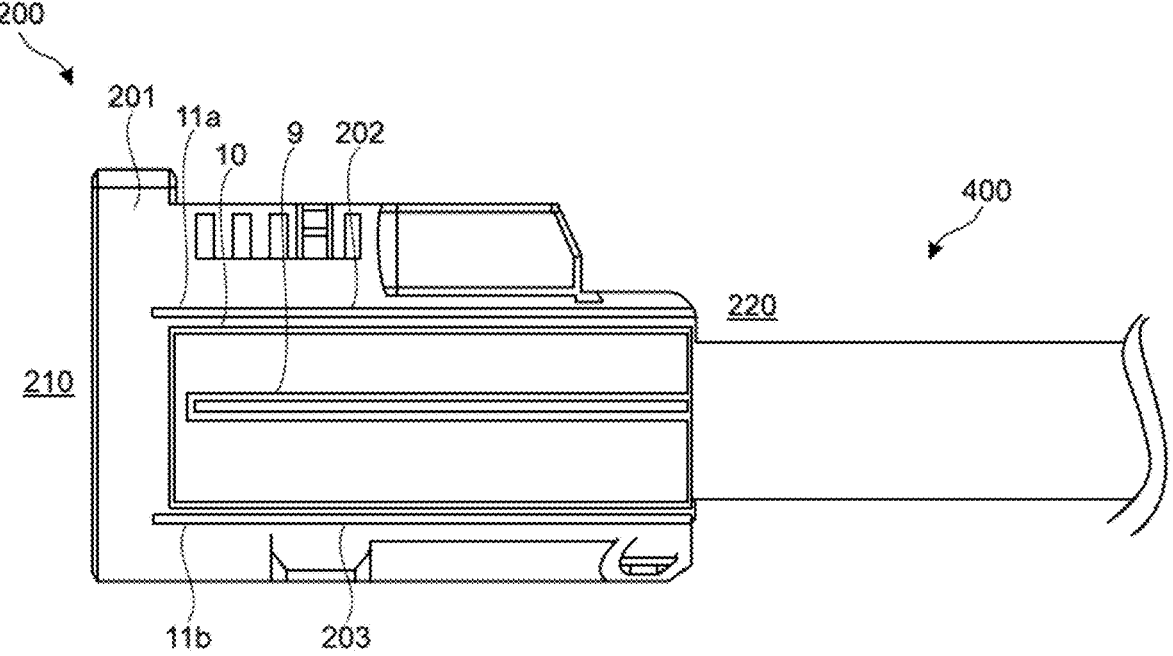
FIG. 4 depicts the receptacle connector according to another main aspect of the present invention.

FIG. 4 describes the receptacle (200) having same properties of the plug connector (100) but having constructional features of a female connector. The receptacle (200) comprises of a housing (201) with first end (210) and a second end (220). The first end (210) of the receptacle (200) is configured to connect with the plug connector (100) and the second end (220) of the receptacle (200) is configured to connect with the cable 400. The receptacle (200) comprises of a socket center contact (9), inner socket conductive layer (10) and outer most conductive layer (11*a*, 11*b*). The socket center contact (9) is made-up of conductive materials for electrical signals and power, the socket center contact (9) is disposed in the center portion of the housing (201). The socket center contact (9) is connected to the inner-most conductive layer (4) of the cable (400) at the second end (220) of the housing (201). The inner socket conductive layer (10) surrounds the socket center contact (9). The inner socket conductive layer (10) is connected to the intermediate conductive layer (3) of the cable (400) at the second end (220) of the housing (201).

The outer most conductive layer (11*a*, 11*b*) is divided into two equal segments separated from each other. The outer most conductive layer (11*a*) is mounted at the inner portion of the housing (201), preferably at the first inner side (202). Similarly, the outer most conductive layer (11*b*) is mounted at the inner portion of the housing (201), preferably at the second inner side (203). Further, the two segments of the outer most conductive layer (11*a*, 11*b*) are configured to connected to the two segments in the outer most conductive layer (2) of the Cable (400) at the second end (220) of the housing (201).

The socket center contact (9) is configured to make electrical contact with the center contact (8) of the plug connector (100). The inner socket conductive layer (10) is configured to connect with the conductive layer (7) of the plug connector (100), and an outer most conductive layer (11*a*, 11*b*) divided into two equal segments separated from each other and used for making electrical connection with the cable connection status pins (6*a*, 6*b*) layered within the housing of the plug connector (100).

During positive locking, the first end (210) of the receptacle (200) is connected to the first end (110) of the plug connector (100). When the receptacle (200) is connected to the plug connector (100), the socket center contact (9) of receptacle (200) is configured to make electrical contact with the center contact (8) of the plug connector (100), the inner socket conductive layer (10) of the receptacle (200) is configured to connect with the conductive layer (7) of the plug connector (100), and the outer most conductive layer (11*a*, 11*b*) of the receptacle (200) is configured for making electrical connection with the cable connection status pins (6*a*, 6*b*) of the plug connector (100).

As represented in FIGS. 1-4, when the receptacle (200) is connected with the plug connector (100), a level detection unit (300) verifies the connectivity and health status of the Cable 400 by providing a cable connect status signal using one of the connection status pins (6*a*[*i*], 6*b*[*i*]) of the plug connector. Further, the level detection unit (300) determines health status and checks whether the cable (400) is subjected to crush or breakage or damage of the cable (400). Moreover, the cable's condition is ascertained by monitoring voltage and current readings. The voltage stability is observed under standard conditions, while deviations in both voltage and current readings indicate damage or absence of connection. The above electrical variations enable the system (1000) to detect instances of crushing, breaking, or damage to the cable. This capability enable the system (1000) to actively monitor the condition of the cable (400) during application. According to an embodiment of the present invention, a level detection and monitoring block (301) in the detection unit (300) monitors the voltage and current levels for various case parameters and interprets results of the monitored levels to provide the connectivity status of the Cable (400) or the device and health status of the cable (400) to a host processor 500.

According to another embodiment of the present invention, the detection unit (300) may comprise a controller or a microcontroller (not shown). The controller/microcontroller may alert the user about the cable health status to the user. According to yet another embodiment of the present invention, a controller/microcontroller for receiving the cable connect status signal and initiating corresponding actions comprising turning power ON or OFF for the device, providing notifications to the host processor 500 upon device detection and cable malfunction, and alerting user about connection status of the device. The advantage of the present invention is that, the system offers real-time monitoring and notification of cable health issues, thereby enhancing operational efficiency, preventing device damage, and improving user experience by alerting users to connectivity issues.

During application, the condition of the Cable (400) is detected by passing current through the cable connection status pins (6*a*, 6*b*) of the plug connector (100) at the first end (for example, a host), through the outer most conductive layer (11*a*, 11*b*) of the receptacle (200) and through the outermost conductive layer (2) of the Cable (400), and looped back through the shorted cable connection status pins (6*a*, 6*b*) of the plug connector (100) in second end (for example, a device) and back through the outermost conductive layer (2) of the Cable (400) and take as an output on one of the cable connection status pins (6*a*, 6*b*) of the plug connector (100) in the first end, which detected and monitored by the detection unit and sent to the controller. The controller determines the cable (400) health and verifies whether the cable is having a cut or cable being crushed or damaged.

Referring to FIG. 5, a flowchart for a method (600) for detecting the connectivity status of the cable (400) or the device and health status of the cable (400) is shown. The method is executed through the system (1000) as described above.

At step 602, the method (600) provides arranging the cable (400) to connect with the device via the cable connector. The cable (400) comprises of the one or more conductive layers comprising the inner-most conductive layer (4) for carrying electrical signals and power for the device, the outer most conductive layer (2) divided into two equal segments separated from each other and used for the cable (400) or device connectivity and health detection, and the intermediate conductive layer (3) arranged between the inner most conductive layer (4) and the outer most conductive layer (2) to: act as a shield, provide required impedance for electrical signals in the inner most conductive layer (4), and provide electromagnetic interference (EMI) shielding.

At step (604), the method (600) provides separating and insulating the one or more conductive layers (2, 3, 4) via the first insulation layer (5) of one or more insulation layers and at step (606) the method (600) provides surrounding the cable (400) via the outermost insulation layer (1).

At step (608), the method (600) provides mounting the plug connector (100) on the PCB, such that the center contact (8) of the plug connector (100) is terminated as the center contact pin (8*a*) for making electrical contact with the center contact of the mating connector.

At step (610) the method (600) provides the conductive layer (7) around the center contact (8) terminated as multiple shield pins (7a, 7b, 7c, 7d) to shield inner components of the plug connector (100) from external electromagnetic interference and at step (612) the method (600) provides the at least two cable connection status pins (6a, 6b) layered within the housing of the plug connector (100) terminated as two cable connection status pins (6a[i], 6b[i]) to detect the connectivity status of the cable (400) or the device and health status of the cable (400).

At step (614), the method (600) provides connecting the plug connector (100) with the receptacle connector (200), such that the socket center contact (9) makes the electrical contact with the center contact (8) of the plug connector (100), the inner socket conductive layer (10) connects with the conductive layer (7) of the plug connector (100), and the outer most conductive layer (11a, 11b) divided into two equal segments separated from each other, is of use for making electrical connection with the cable connection status pins (6a, 6b) layered within the housing of the plug connector (100). The receptacle connector (200) when connected with the plug connector (100) detects connectivity and the health status of the cable (400) by providing a cable connect status signal using one of the connection status pins (6a[i], 6b[i]) of the plug connector (100).

The method (600) provides connectivity status of the cable or the device and health status of the cable by monitoring voltage and current levels for various case parameters using a level detection and monitoring block and interpreting results of the monitored levels. The method (600) provides notifications to host processor upon device detection and cable malfunction, alerting user about connection status of the device by using a microcontroller for receiving the cable connect status signal, and initiating corresponding actions comprising turning power ON or OFF for the device.

The method (600) provides electrical signals and power when the center contact (8) with the central contact pin (8a) is connected with the PCB and provides electrical grounding when the conductive layer (7) with the multiple shield pins (7a, 7b, 7c, 7d) is connected to the PCB.

The method (600) provides monitoring the connectivity status of the cable (400) or the device and the health status of the cable (400) when the cable connection status pins (6a[i], 6b[i]) are connected to the PCB, and the health status includes crush or breakage or damage to the cable (400). The method (600) also provides initiating the cable connect status signal when the cable (400) or cable connection status pins (6a, 6b) of the plug connector (100) is connected to the level detection and monitoring block. The detection is initiated when the receptacle connector (200) mates with the plug connector (100), and the two cable connection status pins (6a, 6b) layered with the housing of the plug connector (100) makes contact with the outer two segmented conductive layer (11a, 11b) in the receptacle connector (200).

The method (600) provides detecting condition of the cable (400) by passing a current through the cable connection status pins (6a, 6b) of the plug connector (100) at the host end, through the outer two segmented conductive layer (11a, 11b) of the receptacle connector (200) and through the outer-most two equally segmented conductive layer (2) of the cable (400), and looped back through the cable connection status pins (6a, 6b) of the plug connector at the host end, which is detected and monitored by the detection unit and sent to the controller.

Details of the method (600) are similar to the details of the system (1000) as discussed above and hence are not repeated for the sake of brevity.

The above functioning may be illustrated by using a cable connected to a Camera device through the following cases:
Case—1 (Voltage: 5V; Current: <1 mA; Cable (400) is Normal)

When sending voltage through the cable (400), the voltage is 5V with a negligible current (<1 mA), indicating that the cable (400) is connected and detected. In this scenario, the power for the camera is turned on, a "DEVICE DETECTED" notification is sent to the host processor 500, and the host initiates the communication with the device. The detection unit receives voltage from the cable (400), the voltage ranges from 4.5V to 5V with negligible current (<1 mA).

Case—2 (Voltage: 5V; Current: <1 mA; Cable (400) is Damaged)

When sending voltage through the cable (400), the voltage remains at 5V with a negligible current (<1 mA), indicating that the cable is connected but damaged or crushed. As a result, the power for the camera is turned off, and a "CABLE MALFUNCTION" notification is sent to the host processor 500. The host then alerts the user about the cable damage. The detection unit receives voltage from the cable, the voltage is less than 1V with a current of more than 100 mA.

Case—3 (Voltage: 5V; Current: <1 mA; Cable (400) is not Connected or Detected)

When sending voltage through the cable (400), the voltage remains at 5V with a negligible current (<1 mA), indicating that the cable (400) is not connected or detected. Consequently, the power for the camera is turned off. When receiving voltage from the cable, the voltage is 0V with a negligible current (<1 mA). In this situation, a "DEVICE NOT DETECTED" notification is sent to the host processor (500), and the host alerts the user about the connection status of the device.

The above cases illustrate different scenarios based on the voltage and current readings during both the sending and receiving phases through the cable.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the scope of the disclosure.

What is claimed is:

1. A system for detecting a connectivity status of a cable or a device and health status of the cable, wherein the cable connects to the device via a cable connector, the system comprising:

the cable comprising:

one or more conductive layers comprising:

an inner-most conductive layer for carrying electrical signals and power for the device;

an outer most conductive layer divided into two equal segments separated from each other and used for the cable or device connectivity and health detection;

an intermediate conductive layer arranged between the inner most conductive layer and the outer most conductive layer to: act as a shield, or provide required impedance for electrical signals in the inner most conductive layer, or provide electromagnetic interference (EMI) shielding;

one or more insulation layers comprising: a first insulation layer for separating and insulating the one or more conductive layers, and an outermost insulation layer surrounding the cable;

a plug connector of use for mounting on a Printed Circuit Board (PCB), comprising:

a center contact terminated as a center contact pin for making electrical contact with a center contact of a mating connector;

a conductive layer provided around the center contact terminated as multiple shield pins to shield inner components of the plug connector from external electromagnetic interference;

at least two cable connection status pins layered within a housing of the plug connector terminated as two cable connection status pins to detect the connectivity status of the cable or the device and health status of the cable; and a receptacle connector of use for connecting with the plug connector, comprising:

a socket center contact for making electrical contact with the center contact of the plug connector;

an inner socket conductive layer for connecting with the conductive layer of the plug connector; and an outer most conductive layer divided into two equal segments separated from each other and used for making electrical connection with the cable connection status pins layered within the housing of the plug connector, wherein the receptacle connector when connected with the plug connector detects connectivity and the health status of the cable by providing a cable connect status signal using one of the connection status pins of the plug connector.

2. The system of claim 1, further comprises a detection unit having a level detection and monitoring block for monitoring voltage and current levels for various case parameters and interpreting results of the monitored levels to provide the connectivity status of the cable or the device and health status of the cable.

3. The system of claim 1, further comprises a microcontroller for receiving the cable connect status signal and initiating corresponding actions comprising turning power ON or OFF for the device, providing notifications to host processor upon device detection and cable malfunction, and alerting user about connection status of the device.

4. The system of claim 1, wherein the center contact with the central contact pin is connected with the PCB and used for electrical signals and power.

5. The system of claim 1, wherein the conductive layer with the multiple shield pins is connected to the PCB for electrical grounding.

6. The system of claim 1, wherein the cable connection status pins are connected to the PCB for monitoring the connectivity status of the cable or the device and health status of the cable, wherein the health status of the cable comprises the cable having a cut, crush or breakage or damage to the cable.

7. The system of claim 1, wherein the inner most conductive layer connects with the center contact of the receptacle connector, the intermediate conductive layer of the cable connects with the inner socket conductive layer of the receptacle connector, and the outer most conductive layer of the cable is connected with the outer most conductive layer of the receptacle connector.

8. The system of claim 1, wherein the cable or the at least two cable connection status pins of the plug connector is connected to a level detection and monitoring block to initiate the cable connect status signal, wherein the receptacle connector mates with the plug connector, and the two cable connection status pins layered with the housing of the plug connector, makes contact with the outer two segmented conductive layer in the receptacle connector to the initiate the detection.

9. The system of claim 1, comprising multiple cables with different configurations present in multiple plug connectors, and wherein each individual cable of the multiple cables present within a single plug connector of the multiple plug connectors is monitored for detection of the connectivity status of the cable or the device and health status of the cable.

10. A method for detecting a connectivity status of a cable or a device and health status of the cable, the method comprising:

arranging the cable to connect with the device via a cable connector, wherein the cable comprising one or more conductive layers comprising: an inner-most conductive layer for carrying electrical signals and power for the device, an outer most conductive layer divided into two equal segments separated from each other and used for the cable or device connectivity and health detection, and an intermediate conductive layer arranged between the inner most conductive layer and the outer most conductive layer to: act as a shield, provide required impedance for electrical signals in the inner most conductive layer, and provide electromagnetic interference (EMI) shielding;

separating and insulating the one or more conductive layers via a first insulation layer of one or more insulation layers;

surrounding the cable via an outermost insulation layer;

mounting a plug connector on a PCB, such that a center contact of the plug connector is terminated as a center contact pin for making electrical contact with a center contact of a mating connector;

providing a conductive layer around the center contact terminated as multiple shield pins to shield inner components of the plug connector from external electromagnetic interference;

providing at least two cable connection status pins layered within a housing of the plug connector terminated as two cable connection status pins to detect the connectivity status of the cable or the device and health status of the cable; and connecting the plug connector with a receptacle connector, such that a socket center contact makes an electrical contact with the center contact of the plug connector, an inner socket conductive layer connects with the conductive layer of the plug connector, and an outer most conductive layer divided into two equal segments separated from each other is of use for making electrical connection with the cable connection status pins layered within the housing of the plug connector, wherein the receptacle connector when connected with the plug connector detects connectivity and the health status of the cable by providing a cable connect status signal using one of the connection status pins of the plug connector.

11. The method of claim 10, wherein connectivity status of the cable or the device and health status of the cable is provided by monitoring voltage and current levels for various case parameters using a level detection and monitoring block and interpreting results of the monitored levels.

12. The method of claim 10, comprising:

providing notifications to host processor upon device detection and cable malfunction;

alerting user about connection status of the device by using a microcontroller for receiving the cable connect status signal, and initiating corresponding actions comprising turning power ON or OFF for the device.

13. The method of claim 10, comprising:

providing electrical signals and power when the center contact with the central contact pin is connected with the PCB.

14. The method of claim 10, comprising:

providing electrical grounding when the conductive layer with the multiple shield pins is connected to the PCB.

15. The method of claim 10, comprising:

monitoring the connectivity status of the cable or the device and the health status of the cable when the cable connection status pins are connected to the PCB, and wherein the health status includes crush or breakage or damage to the cable.

16. The method of claim 10, comprising:

initiating the cable connect status signal when the cable or cable connection status pins of the plug connector is connected to a level detection and monitoring block, wherein the detection is initiated when the receptacle connector mates with the plug connector, and the two cable connection status pins layered with the housing of the plug connector makes contact with the outer two segmented conductive layer in the receptacle connector.

17. The method of claim 10, comprising:

detecting condition of the cable by passing a current through the cable connection status pins of the plug connector at the host end, through the outer two segmented conductive layer of the receptacle connector and through the outer-most two equally segmented conductive layer of the cable, and looped back through the cable connection status pins of the plug connector at the host end, which is detected and monitored by the detection unit and sent to the controller.

\* \* \* \* \*